United States Patent

Kadokura

[11] Patent Number: 5,170,009
[45] Date of Patent: Dec. 8, 1992

[54] ELECTRICALLY CONDUCTIVE COVERS AND ELECTRICALLY CONDUCTIVE COVERS OF ELECTRONIC EQUIPMENT

[75] Inventor: Susumu Kadokura, Sagamihara, Japan

[73] Assignee: Canon Kabushiki Kaisha, Tokyo, Japan

[21] Appl. No.: 673,071

[22] Filed: Mar. 21, 1991

[30] Foreign Application Priority Data

Mar. 22, 1990 [JP] Japan .................................. 2-69820
Mar. 22, 1990 [JP] Japan .................................. 2-69821
Mar. 22, 1990 [JP] Japan .................................. 2-69822
May 8, 1990 [JP] Japan ................................. 2-119463

[51] Int. Cl.⁵ ............................................. H05K 9/00
[52] U.S. Cl. ............................. 174/35 R; 174/35 MS; 361/424
[58] Field of Search ............. 156/150, 151; 174/35 R, 174/35 GC, 35 MS; 219/10.55 D, 10.55 R; 361/424

[56] References Cited

U.S. PATENT DOCUMENTS 2,219,941 10/1940 Rocholl ........................ 174/35 MS
3,783,174 1/1974 Lindgren ........................ 174/35 R
4,382,981 5/1983 Stoetzer et al. .

FOREIGN PATENT DOCUMENTS 1401301 4/1965 France .
60-208498 10/1985 Japan .
61-177399 9/1986 Japan .
61-276979 12/1986 Japan .

Primary Examiner—Leo P. Picard
Assistant Examiner—Bot L. Ledynh
Attorney, Agent, or Firm—Fitzpatrick, Cella, Harper & Scinto

[57] ABSTRACT

A conductive cover has at least two cases connected to each at their connecting surfaces. The cases are provided with electrical continuity through a conductive electrodeposition coating layer at the connecting surfaces. The conductive cover is excellent in electromagnetic shielding properties and also suitable for an exterior cover.

23 Claims, 4 Drawing Sheets

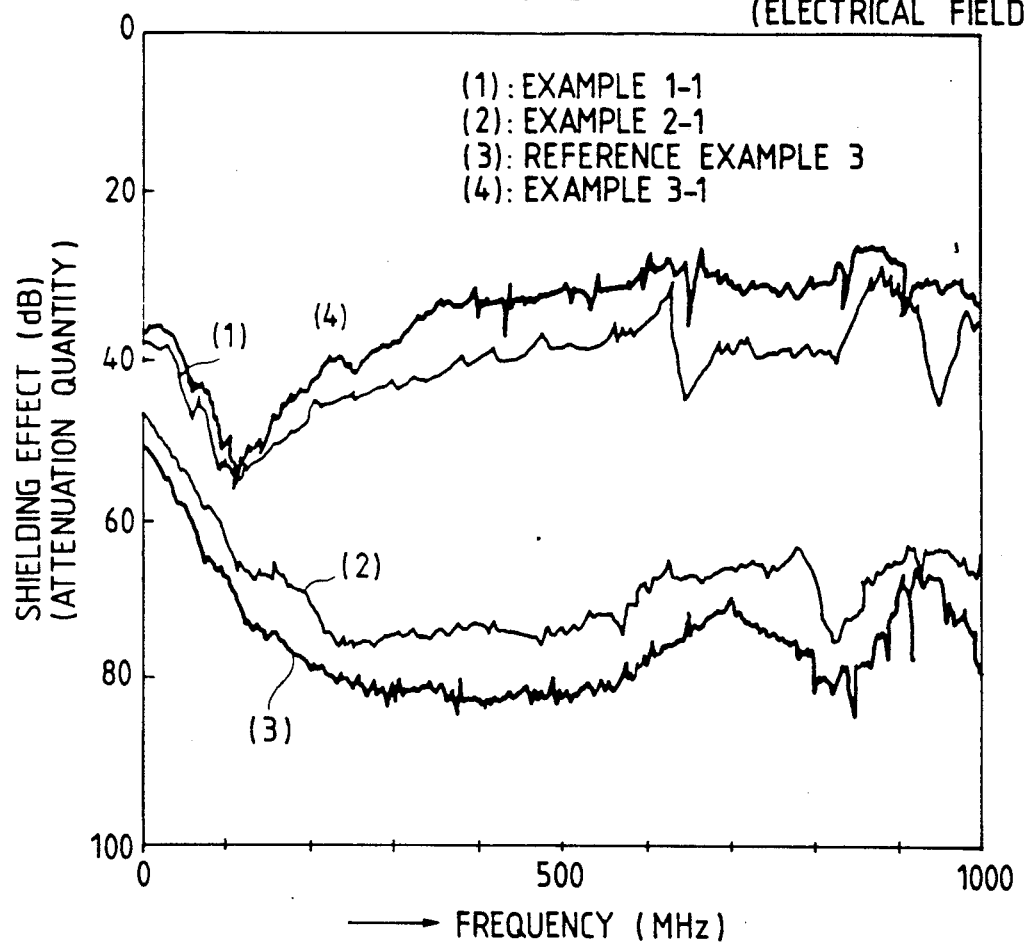
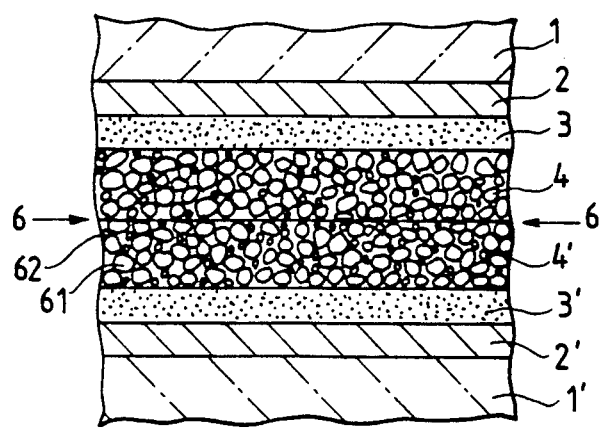

ns of electronic equipment, a known method is to

ELECTRICALLY CONDUCTIVE COVERS AND ELECTRICALLY CONDUCTIVE COVERS OF ELECTRONIC EQUIPMENT

BACKGROUND OF THE INVENTION

1. Field of the Invention

This invention relates to electrically conductive covers made by combining two or more of cases used in optical equipment such as cameras, and in household electric appliances, computers, word processors or measuring equipment.

2. Related Background Art

Traditionally, optical equipment such as cameras, and in household electric appliances, electronic equipment such as computers and word processors or measuring equipment are required to have outer covers which have shielding properties against electromagnetic wave which is generated from the inside of electric equipment such as high frequency oscillation circuit, motors or Brown-tube so that the electronic wave will not leak outside the equipment. In particular, with the recent tendency of electronic equipment to become smaller and lighter, the outer covers are made of plastics, making it an important subject to take shielding measures against electronic wave. Conventionally, the electromagnetic shielding of plastic covers has been made by such measures as spray coating using electroconductive paints, zinc spraying, electroless copper plating, Al vacuum vapor deposition and the use of conductive plastics.

Incidentally, the outer cover of such electronic equipment is usually formed by combining more than one case. To provide the entire outer cover with electromagnetic shielding properties, it is necessary to have electrical continuity through each case. For example, if a case with electroless copper plating and nickel plating is to be used as shown in FIG. 4A, the mere combining of the cases with plated surfaces coming into contact each other gives insufficient adhesion. Since electrical continuity cannot be provided in this event, electromagnetic wave leaks out of the connecting part. Therefore, using the lead wire 43 and the washer 44 as a conventional means to achieve electrical continuity through two or more cases in the cover, for example, the cases have been combined. Namely, the two cases were connected electrically by using lead wire and washer to strengthen the continuity which the mere butt joint of the two cases do not achieve sufficiently. However, this method is getting hard to apply since the securing of space for lead wire arrangement and for the fixing of the washer is becoming difficult with the recent tendency to made products smaller. Furthermore, there is a problem that the increase in the number of parts results in higher costs. Another method to have electrical continuity through the cases is to improve the adhesion of the connecting part by applying silver paste and the like onto the connecting part of the cases without using the lead wire and washer. This method causes a cost problem since it requires the coating of silver paste to the connecting part in its entirety leading to a substantial increase of work steps. Besides, the plastic cases to which electroless copper plating is applied require decorative coating prior to the assembling of the cover. With respect to the connecting part of the case and fixing part of the washer, masking with tapes and fixtures is necessary to prevent the adhesion of coating layer at the time of coating. As a result, the number of work steps increases substantially and costs become higher so that mass-producibility is substantially precluded.

Plastic base materials electrolessly plated with copper have usually used electroless nickel plating on the copper plating to prevent corrosion of the copper. The surface of this nickel plating does not adhere sufficiently to the decorative coating layer. For satisfactory adhesion, the use of special paints (for example, ORIGI PLATE of Origin Electric K.K.) is necessary. This causes a significant problem of costs.

Another method is to provide electromagnetic wave shielding along with decorative coating by giving spray coating of conductive paints to a plastic case. In this case, the layer thickness of at least 50 μm is necessary to secure the electromagnetic wave shielding, with the result that there remains a problem of poor accuracy at the connecting part of the cases. Further, the coating on the connecting part of the cases is liable to peel off, making the continuity between the cases insufficient.

If conductive plastic is used, there is no conductivity at the connecting part since the conductive filler does not come out onto the surface. To gain electrical connection between the two cases, a known method is to connect by the use of a case damping screw as shown in FIG. 4B. The conductive plastic in which conductive filler is mixed into resin is used, along with the use of the damping screw, to connect the two cases and at the same time to provide electrical connection between the cases by improving the contacting properties of the conductive filler. This method, however, requires the processing of the cases beforehand for the use of the damping screw, causing such problems as an increase in the number of work steps, weight increase of conductive covers and increased cost. Also, the cost of conductive plastic materials themselves is high and the mass-producibility is poor. Thus, in response to the recent, growing tendency of electronic equipment becoming smaller and lighter, there is a demand for such conductive cover to be light in weight, to require small space, to be produced in a smaller number of work steps, to have excellent electromagnetic shielding properties and to have a decorative coating layer excellent in coating properties.

SUMMARY OF THE INVENTION

This invention has been made in light of the above problems and for the purpose of providing a conductive cover and its manufacturing method, the conductive cover being capable of achieving good electrical continuity by connecting a plurality of cases at their surfaces, being excellent in electromagnetic wave shielding and having an exterior coating layer with superior coating layer properties. The present invention also aims to provide an electronic equipment which has excellent electromagnetic wave shielding properties and an exterior coating layer with excellent coating properties. In other words, the conductive cover of the present invention is characterized in that at least two cases are connected with each other at their surfaces and electrical continuity is provided between the connecting surfaces of the cases via conductive electrodeposition coating layer.

The electronic equipment of the present invention is an electronic equipment having a source generating electromagnetic wave noise built in room surrounded by a conductive cover, characterized in that the conductive cover comprises at least two cases which are connected to each other at their connecting surfaces and provided with electrical continuity through a conductive electrodeposition layer at the connecting surfaces.

A method of producing the conductive cover of the present invention is characterized in that at least two cases are connected through a conductive electrodeposition layer at their respective connecting surfaces.

According to the present invention, the conductive electrodeposition layer is formed by depositing resins and conductive particles on the case surface at the same time. Unlike the spray coating, conductive particles are deposited very minutely so that even a thin layer has sufficient conductivity and become soft owing to the presence of resins. Consequently, the adhesion becomes good just by connecting the cases, and the connecting of 2 or more conductive cases via conductive electrodeposition layers achieves through electrical continuity between the cases resulting in a conductive cover with excellent electromagnetic wave shielding properties.

BRIEF DESCRIPTION OF THE DRAWINGS

FIG. 5 is a graph showing the electromagentic wave shielding effect gained by the Takeda Riken method as specified in the working example of the present invention;

FIG. 6 illustrates the conductive electrodeposition layer of the present invention.

DETAILED DESCRIPTION OF THE INVENTION

Below mentioned is a detailed explanation of the present invention.

The conductive cover of the present invention is a cover in which at least 2 cases are connected with each other at their respective surfaces. Since there is electrical continuity between the contact surfaces of the cases via conductive electrodeposition coating layer thereinafter "conductive ED layer"), the continuity between the cases improves and electromagentic wave shielding also improves owing to the presence of electrodeposition layer. Besides, the electrodeposition layer has superior properties such as adhesion and corrosion resistance, hence effective for use in exterior coating.

Figure 1A:
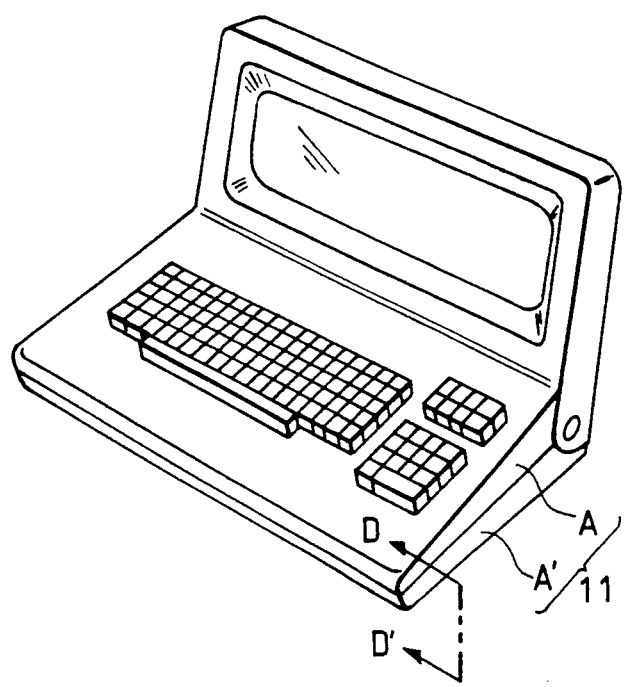
FIG. 1A is a schematic perspective view showing a working mode of a lap-top computer using the conductive cover of the present invention.
Figure 1B:
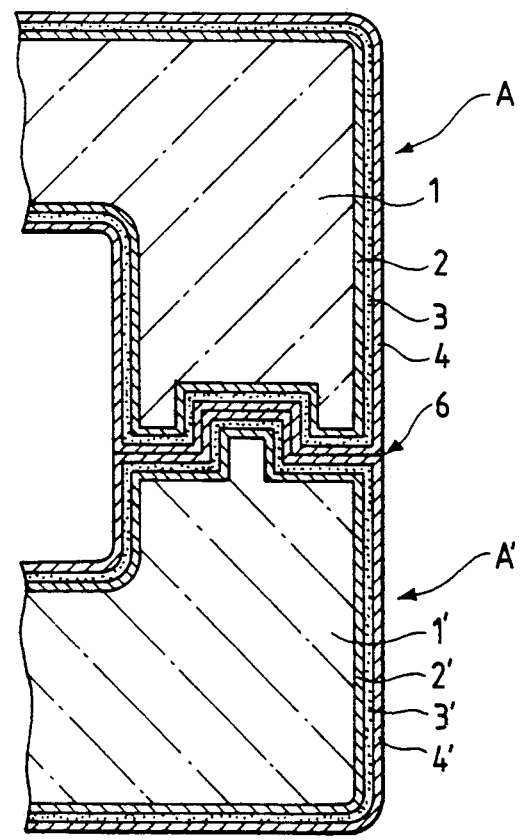
FIG. 1B is schematic partial cross-sectional view showing a working mode of a lap-top computer using the conductive cover of the present invention.

FIG. 1 shows one example of the structure of a laptop personal computer using the conductive cover of the present invention for the exterior cover of the body 11, and (A) is a perspective view and (B) is partially cross-sectional view at the D—D' line. In FIG. 1B, the conductive cover of the invention is made in such a way that with the two cases A and A' being connected with each other at the surface contact point, one case A has a plating layer 2 such as a metal copper thin layer formed on the non-metal base material 1 and thereon is provided a chemically colored layer 3 on which a conductive ED layer 4 is provided, whereas the other case A has the same structure as the case A with the connecting surface 6 between the case A and the case A' having electrical conductivity via the conductive electrodeposition coating layer 4.

In the present invention, the conductive ED layer 4 is obtained by electrically depositing a resin and conductive particles on a chemically colored layer. The conductive particles are highly dense and even a thin layer offers superior conductivity. Also, the conductive ED layer has flexibility to some extent at the connecting surface of the cases so that the case can be closely adhered to each other, making it possible to give conductivity between the cases simply by their connection without spoiling the accuracy of the connecting part.

The conductive ED layer is capable of not only providing electromagnetic wave shield to the cases but also giving satin finish to the case surface by appropriately selecting the size of conductive particles. Thus, the layer can be used also as a decorative coating layer, which makes it unnecessary to have a washing step of the connecting part of the case traditionally required in a decorative coating. Any conductive particles capable of providing the electrodeposition layer with conductivity can be used for the deposition with resin in the electrodeposition layer of the present invention. For example, those particles may be used including ceramic powder coated with metal on the surface (metallized ceramic powder), natural mica powder coated with metal on the surface (metallized natural mica powder) or the mixture thereof, ultra fine metal powders having the average particle size of 0.01-5 micrometers, resin powder having metal coating on the surface or the mixture thereof or the mixture of one or two kinds of powder selected from metallized ceramic powder and metallized natural mica powder and one or two kinds of powder selected from ultra fine metal powder and metallized resin powder. In particular, in case, among the above conductive particles, metallized ceramic powder and metallized natural mica are deposited, it is possible to apply energy to the electrodeposition layer after the electrodeposition is over, for example, to perform complete cross-linking at such a low temperature as 90°-100° C., instead of a normal temperature at 130°-180° C., on the cross-linking of the electrodeposition layer under heat treatment. This method enable to manufacture a conductive ED layer with excellent coating layer properties and it is particularly preferable in the case where the conductive ED layer is used as a decorative coating layer. The reason why the electrodeposition layer containing these metallized ceramics powder or metallized natural mica powder or the mixture thereof hardens at a low energy is not clear. One possible reason is that unlike metal particles the surface of which is easily oxidized, the particles of these powders maintain their surface in a somewhat active condition owing to interaction between powder particle surface and metal coating so that the active surface becomes a cross-linking point to accelerate the hardening of electrodeposition layer.

The metallized ceramic powder and metallized natural mica powder which are used in the present invention include ceramic powder or natural mica powder coated with Cu, Ni, Ag, Au, Sn, etc. The effective plating material for such powder particle surfaces is Cu, Ag and Ni from the standpoint of shielding and costs. A method of forming a metal film onto a powder particle surface is electroless plating. When the plating thickness of powder surface is 0.05-3 micrometers, particularly 0.15-2 micrometers, excellent shielding properties and superior coating layer properties at the time of low temperature curing are obtained. When the plating thickness is more than 3 micrometers, the surface properties become similar to those of metal particles. Then, as the surface becomes very active, it is oxidized in air to decrease cross-linking points, the curing of electrodeposition layer is liable to become insufficient at the time of low-temperature baking.

In the formation of Ni plating on powder, for example, as disclosed in Japanese Patent Application Laid-open No. 61-276979 aqueous suspension of powder is prepared and electroless nickel plating used solution is added thereto to form nickel plating on powder particle surfaces with a low content of phosphorus, e.g. 5% or less, then the conductivity improves and the electrodeposition layer having shielding properties almost comparable to Cu plated powder can be formed.

The average particle size of ceramic powder and natural mica powder is preferably 0.1-5 micrometers, particularly 0.15-3 μm and further 0.5-2 micrometers when consideration is given to the surface area which contributes to surface activity and dispersibility in electrodeposition coatings.

The ceramic used in the present invention is a non-metallic inorganic solid material which includes aluminium oxide, titanium nitride, manganese nitride, tungusten nitride, tungusten carbide, lanthanum nitride, aluminium silicate, molybednum disulfide and titanium oxide and silicate. Natural mica includes phlogopite mica, sericite mica and muscovite mica.

Then, for conductive particles, as mentioned above, ultra fine particle metal powder having the average particle size of 0.01-5 μm and surface-metallized resin powder having the average particle size of 0.1-5 μm may be used. For example, ultra-fine particle metal powder obtained by thermal plasma evaporation method includes powder of Ag, Co, Cu, Fe, Mn, Ni, Pd, Sn and Te. The average particle size is 0.01-5 micrometers, particularly 0.01-0.1 micrometer and further 0.03-0.07 micrometers. If the size is below 0.01 micrometers, secondary coagulation takes place. On the other hand, if a particle size is larger than 5 micrometers, it sediments in electrodeposition paint and the coating material generates metallic sheen, causing hindrance to coating with desired color. Also, metallized resin powder of the present invention is obtained, as in the case of ceramics, by forming a layer of Cu or Ni in the thickness of 0.05-3 micrometers on the resin powder surface of fluorine resin, polyethylene resin, acrylic resin, polystyrene resin, nylon, etc. The average particle size of the resin powder is preferably ca. 0.1-5 micrometers.

With respect to the above conductive particles, electrodeposition coating materials having electromagnetic wave shielding and superior coating layer properties can be obtained by including each of them in a electrodeposition layer. Where ultra fine particle metal powder or metalized resin powder or a mixture thereof is added to metallized ceramic powder or metallized mica powder or a mixture thereof 1 in the weight ratio of 0.2-3, the gap between particles of metallized ceramic powder and/or metallized natural mica powder 61 is filled, as shown in FIG. 6, with particles of ultra fine particle metal powder and/or metallized resin powder 62, increasing a contact area between powders. As a result, the conductivity of the case connecting surface improves to further strengthen the shielding properties of the conductive cover. At the same time, by the action of metallized ceramic powder and/or metallized natural mica powder, the heat treatment at low temperature gives a conductive cover with ED layer which offers superior adhesion to the base material having excellent coating layer properties. Resins capable of electrodepositing in the present invention are those conventionally used in the electrodeposition paints. One example of such resin in the case of anionic electrodeposition paints is a resin having an anionic functional group like a carboxyl group which gives a negative charge and hydrophilic properties which are necessary for the electrodeposition of resin, specifically acrylic melamine resin, acrylic resin, alkyd resin, maleic polybutadiene or its half ester and half-amide. In the case of cationic electrodeposition paints, a resin which may be used is those having a cationic functional group like an amino group which gives a positive charge and hydrophilic properties, specifically epoxy resin, urethane resin, polyester resin, polyether resin, etc. Among these resins, those which are not self-crosslinkable are used in a mixture with, for example, melamine resins or block polyisocyanate compound for a curing agent.

The content of conductive particles in the conductive ED layer of the present invention is 5-50 wt. %, preferably 10-40 wt. % and particularly 15-35 wt. % in the electrodeposition layer after curing in consideration of the continuity of the cases A and A', electromagnetic wave shielding property of conductive cover (for example, the attenuation quantity more than 30-40 dB which is a VCCI regulation value) or, coating layer properties as a decorative coating layer such as corrosion resistance or the adhesion to base material.

If the content is larger than 50 wt. %, the layer becomes unsuitable as exterior coating layer due to embrittlement. If the content is below 5 wt. %, the electrical continuity between the cases is insufficient, and leave the electromagnetic wave shielding property of the conductive cover being unsatisfactory.

The conductive particles in the electrodeposition layer can be determined by means of X-ray microanalyzer, and the content can be measured with the thermal weight analytical equipment.

A manufacturing method of the conductive cover of the present invention shown in FIG. 1 is described below.

To begin with, the non-metallic base material 1 of the case A is plated and further a chemically colored layer is formed thereon. There is no particular restriction about non-metal base materials. Plastic materials which are generally used in plastic cases such as lap-top computers and cordless telephones, e.g. ABS resin, polycarbonate resin, ABS-polycarbonate alloy, polyacetal resin, polybutylene terephthalate, polyethylene telephthalate, polyether imide resin, glass fiber-filled ABS resin, glass fiber-filled polycarbonate resin, polyphenylene ether and polypropylene.

With respect to non-metal base materials, as conducted with the known plating method on plastics, they are etched, then treated with catalyst (e.g. palladium treatment) and made conductive, followed by the formation of a metal thin layers. As a method of forming a metal thin layer on the above non-metal base materials, it is preferable to apply electroless plating or electro plating.

Then, a chemically colored layer 3 is formed on a metal copper thin layer. As the chemically colored layer 3, the one obtained, for example, by surface treatment of the plating layer 2 formed on the base material 1 has good adhesion to the conductive ED layer, is preferred to improve the adhesion between the base material 1 and the conductive electrodeposition layer 4.

It is not clear why the chemically-colored layer shows superior adhesion to the conductive ED layer. However, the surface of the chemically colored layer contains a large number of very fine pores, and since physical adsorption to the ED layer occurs and at the same time chemical adsorption takes place between the functional group of polymer in the ED layer and the active point on the surface of conductive particles and chemically-colored layer, which causes the outstanding adhesion. The chemically colored layer obtained from the surface treatment of copper in the present invention, e.g. copper oxide, copper suboxide, copper carbonate, copper sulfide and ammonium copper hydroxide, is excellent in the adhesion of the ED layer. Particularly, copper oxide is preferred in terms of adhesion between the ED layer and the base material, corrosion resistance of metal thin layers 2 and 2' and the uniformity of the ED layer. Accordingly, it is preferable to use copper for a metal thin layer in this invention. In case a material other than copper is to be used as metal base material, it is desirable to apply copper plating to periphery thereof.

In that event, the metal thin layer 2 is used to form a chemically-colored layer on the electrode and surface for the formation of the ED layer, and the layer thickness should be not less than 0.01 $\mu$m and 0.2 $\mu$m, preferably 0.05-0.15 $\mu$m. If the layer thickness exceeds 0.2 $\mu$m, the formation of copper thin layer takes time and working efficiency lowers with the increasing weight of a material to be electrodeposition-coated, which is not preferable. If electrodeposition coating layer is formed directly on the metal copper thin layer, copper dissolves into the electrodeposition paint and accumulates there, causing adverse influence to the coating layer properties. On the other hand, if the electrodeposition coating layer is formed on the chemically colored copper oxide layer, the dissolution of copper is prevented and the existence of copper ions is not in the electrodeposition paint. As a method to form a chemically colored layer, a copper oxide layer can be formed by soaking the base material with the formed copper plating layer in the mixed solution such as copper sulfate+potassium chlorate, and copper chloride+copper acetate+alum. A method to form the sulfide layer of copper includes the soaking into the mixed solution such as potassium sulfide+anmonium chloride, sodium hyposulfite+lead acetate, etc. A method to form the hydroxide layer of copper includes the soaking into the mixed solution such as copper nitrate+ammonium chloride+acetic acid, etc. Further, a method to form the suboxide layer of copper, one of the oxide layers, includes the soaking into the mixed solution such as copper sulfate+sodium chloride, copper sulfate+ammonium chloride, etc.

Then, the base material with chemically colored layer is soaked in the electrodeposition paint to give electrodeposition and form an electrodeposition layer on the chemically-colored layer. This electrodeposition step should be in accordance with an ordinary method of electrodeposition coating. For example, in the case where the electrodeposition resin is anionic, the base material side is an anode, and in the case of being cationic, the base material is a cathode. With these electrodes, electrodeposition is performed under the conditions of a solution temperature being 20°-25° C., the applied voltage being 50-200 V., the current density being 0.5-3A/dm$^2$ and the treatment time being 1-5 minutes to deposit resin and conductive particles on the chemically colored layer. The reason for the elution of resin and conductive particles are deposited together is explained as follows. The resin capable of electrodeposition has its functional group ionized which is bonded to the resin in paint, by the application of direct voltage between a material to be coated and a counter electrode, resin particles are attracted to the material to deposit. Since this resin is adsorbed to the periphery of the conductive particles in the electrodeposition paint, the conductive particles move along with the movement of the resin toward the material to be coated to deposit the particles and resin on the material.

The electrodeposition paint used in this step of the present invention is prepared, for example, in such a way that conductive particles and resin capable of electrodeposition are dispersed by the ball mill over 24-35 hours, followed by the dilution with desalted water to make the solid content at 7-15 wt. %, preferably 10-15 wt. %. The electrodeposition paint can be colored as necessary by adding pigments, etc., if necessary Pigments for coloring is preferably added in the amount of 1-3 wt. %.

A preferable mixing ratio of the conductive particles and the resins capable of electrodeposition is 1-15 parts by weight, preferably 10-20 parts by weight, particularly 7-15 parts, relative to 100 parts by weight of the resin. Within this range, it is possible to co-deposit the conductive particles sufficient to provide shielding properties, and also to provide the coating layer properties such as adhesion to the base material or flexibility of the electrodeposition layer without sedimentation of conductive particles in the electrodeposition paint.

The conductive particles to be dispersed in the electrodeposition paint include powders to be co-deposited together with the resin onto electrodeposition layer, such as the above-mentioned metallized ceramic powder or metallized natural mica powder, and the mixture thereof and powders in which ultra fine particle metal powders having an average particle size of 0.01-5 $\mu$m or the surface metal coated resin powders having an average particle size of 0.1-5 $\mu$m or the mixture thereof is mixed with the metallized ceramic powders or metallized natural mica powder or the mixture of the same.

The resulting electrodeposition layer is washed with water and subjected to heat treatment for curing.

Sufficient cross-linking can be obtained at the temperature of as low as 90°-100° C. in an oven and for the curing time of 20-180 minutes where metallized ceramic powder, metallized natural mica or their mixture is used. When an ordinary metal powder or metallized resin powder or ultra fine particle metal powder is used, it is desirable to conduct heat treatment at ca. 120-180° C. In this way, the case A can be obtained which has electromagnetic wave shielding and exterior coating The thickness of electrodeposition coating layer in this invention should be preferably thin enough to secure the electrical continuity between the cases as well as shielding properties in view of the case connection accuracy, uniformity of coating layer, adhesiveness and easiness of decorative coating, specifically 5–40 μm and particularly 7–25 μm. Then, after the case A' is prepared in the same way as in the case A, the contact surface 6 is matched with the contact surface 6' to assemble the conductive cover 10. At the time of this assembly, A and A' can be fixed by screws or can be inserted utilizing the toughness of the plastic case. Thus, electrical continuity can be sufficiently secured between the cases A and A' by contacting them through the conductive ED layer, so that a conductive cover having excellent electromagnetic shielding properties can be obtained easily.

The adhesion of the conductive ED layer to the base material can be improved by applying a chemically colored layer for a undercoating layer. Also, the case surface can be made to uniform satin-finish. Therefore, the conductive ED layer can be used as a decorative coating layer. It is unnecessary to give masking to the connecting part between the cases, which has been required on the application of a decorative coating to the cases subjected to electroless plating as electromagnetic wave shielding measures.

Further, in this invention, it can be followed that after the formation of the electrodeposition layers 4 and 4' on the base material 1 and 1', the cases A and A' are connected with each other, followed by heat treatment.

In this event, the adhesion between the cases is further improved and a conductive cover having the excellent electromagnetic wave shielding properties can be obtained.

Figure 2:
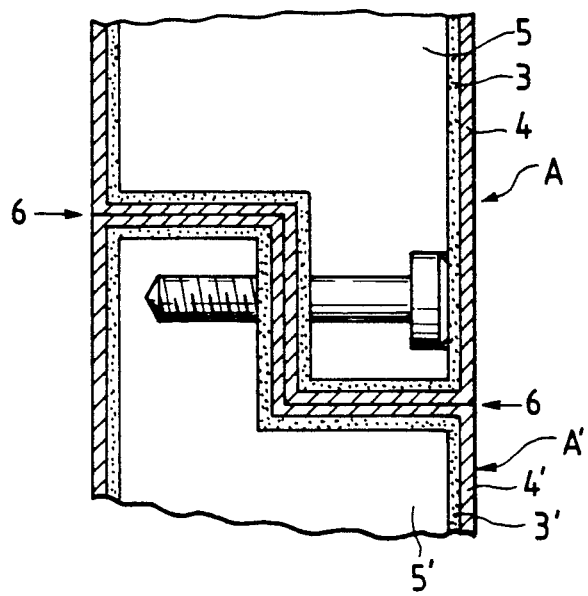
FIG. 2 is a cross-sectional schematic view showing other working mode of the conductive cover of the present invention.

FIG. 2 is an enlarged partial cross-sectional view of the connecting part showing other example of the structure of the conductive cover in the present invention. In FIG. 2, the conductive cover of the present invention consists of the cases A and A' being connected with each other at the surface contact points, in which on the metal base material 5 of the case A is provided a chemically-colored layer 3 and further a conductive electrodeposition layer 4 is provided thereon, whereas the other case A' has the same structure as the case A and the surface contact points of the two cases A and A' have electrical continuity via the conductive electrodeposition coating layer 4.

The metal base material 5 is made of, for example, copper, zinc, nickel, tin, aluminium, iron and their alloys. The conductive cover of the present invention shown in FIG. 2 is made in such a way that following, for example, the same method as shown in FIG. 1, a chemically colored layer of copper oxide is formed in the presence of alkali on a metal base material such as copper and then an electrodeposition coating layer is formed thereon by the same electrodeposition coating method as shown in FIGS. 1A and 1B, followed by the cross-linking of said electrodeposition coating layer to obtain a case having improved adhesiveness of the ED layer.

Figure 3A:
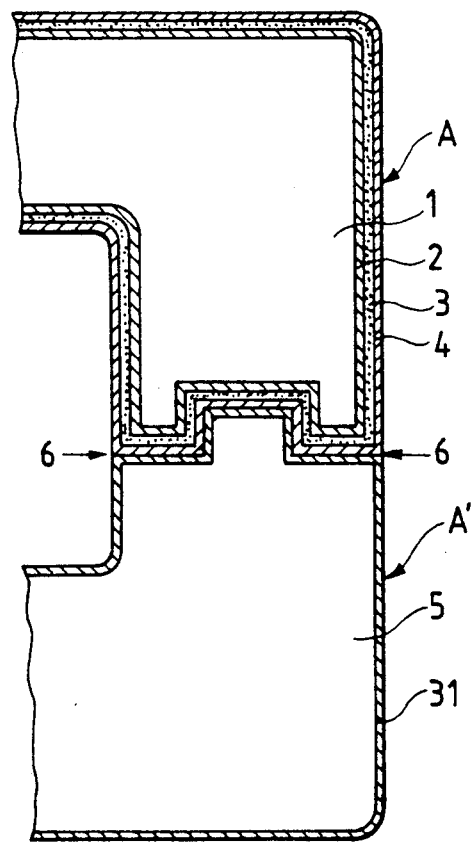
FIGS. 3A and 3B are cross-sectional schematic views further showing other working modes of the conductive cover of the present invention.
Figure 3B:
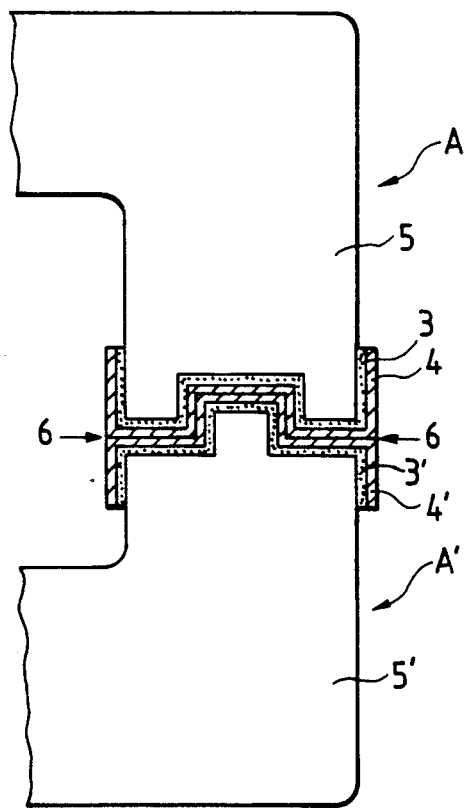
Figure 4A:
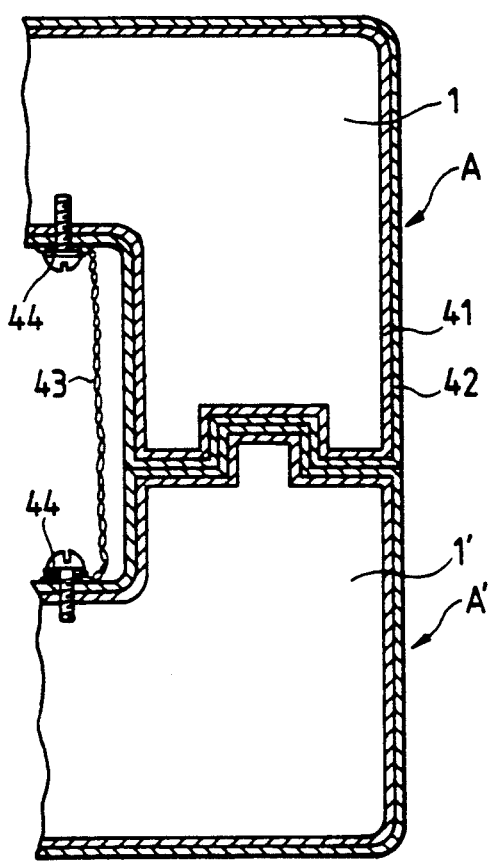
FIG. 4A is a cross-sectional schematic view showing a working mode using washers and a lead wire of a traditional conductive cover.
Figure 4B:
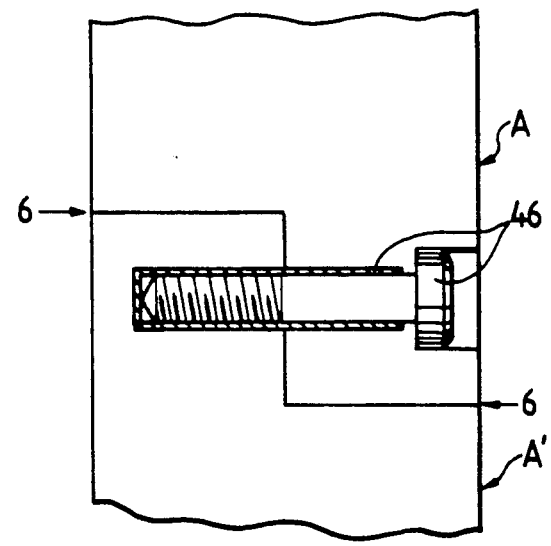
FIG. 4B is a cross-sectional schematic view showing a working mode using a damping screw of a traditional conductive cover.

In case a metal base material other than copper is used, a chemically colored layer of copper oxide can be obtained by oxidation after copper plating is applied to the surface. This method is desirable in that the adhesion to the ED layer improves. Then, the case A and the case A' thus obtained are connected to obtain a conductive cover having excellent electromagnetic wave shield. FIG. 3A shows further another embodiment of the invention. The case A, like the case A FIGS. 1A and 1B is made by applying plating to a non-metal base material to form a chemically colored layer, followed by the formation of a conductive electrodeposition layer. On the other hand, the case A' has the surface 31 electrolessly plated with nickel on the surface of a copper base material, and a conductive cover having superior electromagnetic shielding properties is also obtained by connecting the above cases A and A'. This conductive cover is used, for instance, in the case where no decorative coating is necessary in a lower part corresponding to the case A'. Alternately, as shown in FIG. 3B, a conductive cover may be prepared by forming a conductive ED layer on the connecting surface of the case A and case A' made of a metallic base material and its surrounding, or the connecting surface of either of the cases A and A' and its surrounding. This mode is desired in case, for example, in the case where the conductive cover of the present invention is used not as an exterior cover for electronic equipment but as a shield case to be provided inside the exterior cover. Needless to say, the mode shown in FIGS. 1–3A can be used as a shield case. In particular, if a conductive cover based on a resin base material is used as a shield case, it is possible to make the electronic equipment, etc. substantially lighter.

As explained above, the conductive cover of the present invention helps improves the earth connection between the cases and has the excellent electromagnetic wave shielding properties since the surface connecting point of the cases having at least 2 electrodeposition coating layers connecting to each other have electrical continuity via the conductive electrodeposition coating layer. The conductive cover of the present invention solves such problems that when two or more cases of prior art are connected, the continuity between the cases is insufficient, which causes insufficient electromagnetic wave shield by the conductive cover, and needs an electrical connecting means between the cases to bring above enlargement of the conductive cover.

According to the present invention, the conductive ED layer can be used as a decorative coating layer due to the improvement of coating layer properties such as adhesion to the base material and corrosion resistance. The conductive cover of the present invention can be used as an exterior cover for an electronic equipment. Furthermore, the step of masking the connecting part between the cases can be omitted which has been necessary when a decorative coating is applied to the case subjected to electroless copper plating as the measure of the prior art for electromagnetic wave shield.

Besides, according to the present invention, it is possible at the same time to provide electromagnetic wave shielding properties to plastic base materials, give electrical continuity between the connecting parts of the cases and conduct decorative coating of plastic base materials, thereby manufacturing a conductive cover at a low cost and with high productivity. In addition, the invention makes it possible to obtain at a low cost electronic equipment which is small in size, light in weight and excellent in electromagnetic wave shielding.

EXAMPLES

The present invention is below explained in detail using working examples In the following examples, the particle size of the powders has been measured with a centrifugal sedimentation type particle size distribution measuring apparatus (SACP-3; Shimadzu), and each powder has been deemed to be a dense sphere of the same particle size.

The determination of conductive particles in the electrodeposition layer has been made with X-ray microanalyzer, and the content has been analyzed with a thermal weight analysis equipment (Tradename: Thermal Analysis System 7 Series: PERKIN-ELMER). With respect to the electromagnetic wave shielding effect, electromagnetic wave of 50 Hz-1000 MHz has been measured for attenuation characteristics using the spectral and spectrum analyzer of Takeda Riken (Tradename: TR4172; ADVANTEST K.K.).

EXAMPLE 1—1

Base materials 1 and 1' for ABS resin-molded two cases A and A' used for the upper and lower covers of a lap-top personal computer body were soaked for one minute in the etching solution of $CrO_3$—$H_2SO_4$—$H_2O$. After water-washing, the materials were soaked for two minutes at room temperature using a mixed solution of 30 g/l stannous chloride and 20 ml/l hydrochloric acid, followed by water washing again. Subsequently, the materials were soaked for 2 minutes at room temperature using as activator solution a mixed solution of 0.3 g/l palladium chloride and 3 ml/l hydrochloric acid. Then, plating was carried out for 5 minutes at the bath temperature of 70° C. at pH 13.0 using a electroless copper plating solution (manufactured by Okuno Seiyaku Kogyo) to form a copper thin layer of 0.2 $\mu$m thickness. The material was further soaked for 30 seconds at 70° C. in the mixed aq. solution of 5% sodium hydroxide and 1% potassium persulfate to form a copper oxide layer as a chemically colored layer.

On the other hand, in 100 parts by weight of acrylic melamine resin (Tradename: Honeybright C-IL, produced by Honey Kasei), 10 parts by weight of alumina particle of 1 micrometer in average size the surface of which was electrolessly plated to 0.5 $\mu$m thickness with nickel was dispersed by the use of a ball mill for 30 hours. Then, the solution was diluted to 15% by weight with desalted water, and 2.0 weight % of carbon black was added to give coloring, thus preparing electrodeposition paints. Thereafter, the electrodeposition was conducted for 3 minutes with the applied voltage of 150 V. at the both temperature of 25° C. and pH of 8-9 using the above base materials 1 and 1' as an anode and a 0.5 t stainless plate as an counter electrode to form a 25 micrometers electrodeposition coating layer on the entire surface of the base material. After the electrodeposition, water washing was performed, and heating was then conducted in the oven at 97° C.±1° C. for 60 minutes for curing and the cases A and A' were obtained.

The co-deposition amount of the electrodeposition coating layer formed on this case was 30% by weight. Tests were made about adhesion and corrosion resistance of the electrodeposition coating layer. Table 1.1 shows the results.

The adhesion was evaluated in such a way, according to the method of a grid test specified in JIS-K5400, that a test piece was provided with grid-like cuts so as to make 100 one mm squares per 1 cm², and an adhesive tape was stuck to it and the number of squares remaining on the base material after the tape was peeled off was counted. The corrosion resistance was measured in accordance with the salt spray test of JIS-K5400 in terms of the width of swelling (one side) appearing on the cut part of the coating layer. Then, the cases A and A' were combined utilizing the concave and convex (or dent and projection) shapes of the connecting parts to make the exterior cover 11 of a lap-top personal computer body and the electromagnetic wave shielding effect of the exterior cover was measured.

As shown in FIG. 7, the attenuation of 30-40 dB or more was observed in all bands of frequency so that the regulations of the U.S. FCC (Federal Communications Commission) and UCCI were cleared. It is evident from this result that there is good electrical continuity between the case A and the case A'.

EXAMPLE 1-2

Base materials 1 and 1' for the ABS resin-moled two cases A and A' used for the upper and lower covers of a word processor were treated with $CrO_3$—$H_2SO_4$—$H_2O$ etching solution for one minute. The material was, after water washing, soaked for 2 minutes at room temperature in the mixed solution of 30 g/l stannous chloride and 20 ml/l hydrochloric acid as sensitizer solution, followed by water washing again. Subsequently, the mixed solution of 0.3 g/l palladium chloride and 3 ml/l hydrochloric acid was used as an activator solution to treat the material for 2 minutes at room temperature. Then, plating was conducted with a electroless copper plating solution (Okuno Seiyaku Kogyo), at pH=13.0 for 5 minutes at the bath temperature of 70° C. to form a copper thin layer of 0.2 micrometer thickness. The material was thereafter treated with the mixed aq. solution of 5% sodium hydroxide and 1% potassium persulfate for one minute at 70° C. to form an copper oxide layer as a chemically colored layer. To 100 parts by weight of acrylic melamine resin (Tradename: Honeybrite C-IL, manufactured by Honey Kasei) was dispersed for 30 hours with a ball mill 10 parts by weight of alumina having the average particle size of 1 micrometer on the surface of which electroless copper plating was given in the thickness of 0.2 $\mu$m, and then the resulting solution was diluted to 15% by weight with desalted water and the above cases A and A' which was plated and had a chemically colored layer formed were soaked in the electrodeposition paints in which 2.0% by weight of carbon black was added to give coloring. Under the conditions of the bath temperature being 25° C. and pH being 8-9, the electrodeposition was carried out for 3 minutes at 150 V. using the base material as an anode and a 0.5 t stainless plate as a counter electrode to form a coating film having a thickness of 25 $\mu$m. Following the electrodeposition, water-washing was perform and heating was done in an oven for 60 minutes at the temperature of 97° C.±1° C. for curing and the cases A and A' were obtained. The content of metallized alumina in the electrodeposition coating layer formed on the cases A and A' was 30 weight %. Test was done about the adhesiveness and corrosion resistance of the electrodeposition layer. The result was that, as in the case of Example 1—1, the adhesion was 100/100 and corrosion resistance was 1 mm or less in terms of one-side swelling width. The result was so excellent that these cases were sufficiently applicable to exterior covers. Subsequently, the above cases A and A' were combined utilizing the convex and concave shapes of the connecting part to prepare the exterior cover for a word processor.

The exterior cover was measured for its electromagnetic wave shielding effect in the same way as in the case of Example 1—1. The result was likewise excellent and cleared the regulation of FCC and VCCI.

EXAMPLE 1-3

A base material 1 made by the molding of polyphenylene ether resin (PPE resin) for the case A, used for a lap-top personal computer body was soaked in the mixed solution of 300 ml/l of 98% sulfuric acid and 200 g/l of chromatic anhydride at 40° C. for 5 minutes for pre-etching and then in the solution of 80 ml/l of 36% hydrochloric acid at room temperature for 2 minutes.

The material was then soaked in the mixed solution of 300 ml/l of 36% hydrochloric acid and 200 ml/l of GX etchant at 40° C. for 10 minutes and further in 80 ml/l of 36% hydrochloric acid at room temperature for 2 minutes. Lastly, the material was soaked in a conditioner solution (Tradename: TSP neutralizer, produced by Okuno Seiyaku Kogyo) at 30° C. for 3 minutes to etch the surface of the PPE resin base material. As in the case of Example 1—1, a copper plating layer and copper oxide layer were formed. Also, to 100 parts by weight of acrylic melamine resin (Tradename: Honeybrite C-IL, produced by Honey Kasei) was dispersed for 30 minutes with a ball mill 15 parts by weight of silicon carbide having the average particle size of 5 μm on the surface of which non-electrolytic gold plating was given in the thickness of 0.5 micrometers. Thereafter, the resulting solution was diluted to 15% by weight with desalted water and 2.0% by weight of carbon black was added for coloring to reprepare electrodeposition paints.

The above base material 1 was soaked in this electrodeposition paints. Then, the electrodeposition was conducted at 150 V. for 3 minutes under the conditions of the temperature being 25° C. and pH being 8-9, using the base material as an anode and 0.5 t stainless plate as a counter electrode to form a coating layer of 26 micrometer thickness. Following the electrodeposition, water-washing was performed and heating conducted in an over at 97° C.±1° C. for 60 minutes for curing and the case A was obtained. The content of metallized ceramic powder in the electrodeposition layer formed on the case A was 35 wt. %.

On the other hand, the base material 1' for the brass plate-made case A' used for lap-top personal computer body was subjected to solvent degreasing. Thereafter, the material was treated with the mixed aq. solution of 5% sodium hydroxide and 1% potassium persulfate at 70° C. for 1 minute to form a copper oxide layer as a chemically colored layer.

To 100 parts by weight of acrylic melamine resin (tradename: Honeybrite C-IL, manufactured by Honey Kasei) was dispersed for 30 hours with a ball mill 10 parts by weight of alumina having the average particle size of 1 micrometer on the surface of which non-electrolytic nickel plating was given in the thickness of 0.5 micrometers. The resulting solution was diluted to 15% by weight with desalted water. Using the electrodeposition paint prepared by adding 2.0% by weight of carbon black, the electrodeposition was conducted at 130 V. for 3 minutes under the conditions of the temperature being 25° C. and pH being 8-9, using the base material as an anode and 0.5 t stainless plate as a counter electrode to form the coating layer of 20 micrometer thickness. Following the electrodeposition, water-washing was performed and heating was applied at 97° C.±1° C. in an oven for 60 minutes for curing to obtain the case A'. The content of metallized alumina powder in the electrodeposition layer of the case A' was 22 wt. %.

As in the case of Example 1—1, a test was conducted about the adhesion and corrosion resistance of electrodeposition layer which had been formed on the cases A and A' thus obtained. The result was such that like the example 1—1, the adhesion was 100/100 and the corrosion resistance was 1 mm or less in terms of one-side swelling width, hence both of the cases A and A' were applicable for an exterior cover.

Then, as in the case of Example 1—1, the case A and the case A' were connected to assemble the exterior cover 11 of a lap-top personal computer body. The exterior cover was measured for the electromagnetic wave shielding effect in the same way as in Example 1—1. The result was excellent and cleared the regulations of FCC and VCCI.

EXAMPLE 1-4

Electrolytic degreasing was done for brass plate base materials 5 and 5' for the two cases A and A' used for the upper and lower covers of a lap-top personal computer body in FIG. 2. Then, using a mixed solution of 5% sodium hydroxide and 1% potassium persulfate, the material was treated at 70° C. for one minute to form a copper oxide layer as a chemically-colored layer. On the other hand, in 100 parts by weight of acrylic melamine resin (tradename: Honeybrite C-IL, manufactured by Honey Kasei) was dispersed for 30 hours with a ball mill 10 parts by weight of alumina having the average particle size of 0.5 μm on the surface of which electroless nickel plating was given in the thickness of 0.1 μm. The solution was then diluted to 15% by weight with desalted water and further 2.0% by weight of carbon black was added for coloring to prepare electrodeposition paints.

Subsequently, the base material 5 and 5' having the chemically colored layers 3 and 3' were soaked in the above electrodeposition paints, and under the conditions of the bath temperature being 25° C. and pH being 8-9 electrodeposition was done at 150 V. for 3 minutes using the base material as an anode and 0.5 t stainless plate as a counter electrode to form a coating layer of 25 micrometers thickness. Following electrodeposition, water-washing was performed and heating conducted at 97° C.±1° C. in an oven for 60 minutes to curing to obtain the cases A and A'. The content of metallized ceramic powder in the electrodeposition layer of the cases A and A' was 30 wt. %.

A test was conducted about the adhesion and corrosion resistance of the electrodeposition layer of the cases A and A'. The result was that like the Example 1—1, the adhesion was 100/100 and the corrosion resistance was 1 mm or less in terms of one-side swelling width, thus the cases A and A' being applicable in the exterior cover.

Then, the cases A and A' were used and fixed with resin-made screws to assemble the exterior cover 11 of a lap-top personal computer body. The electromagnetic wave shielding effect of this exterior cover was very good, clearing the regulations of FCC and VCCI. It is evident from this result that there is good electrical continuity between the cases A and A'.

REFERENCE EXAMPLE 1

On a copper thin layer formed on an ABS base material as in Example 1—1, the same electrodeposition layer as in Example 1—1 was provided to obtain the cases A and A'. The results of the test on the adhesion and corrosion resistance of the electrodeposition layer for the cases A and A' are shown in Table 1—1. As in Example 1—1, the conductive cover made by connecting the above cases A and A' was measured for electromagnetic wave shielding properties to obtain excellent values as in Example 1—1.

REFERENCE EXAMPLE 2

Electroless copper plating was given to the ABS base material of Example 1—1 to form a nickelplated thin layer, on which the same electrodeposition layer as in Example 1 was provided to obtain the cases A and A'. Their adhesion and corrosion resistance were tested and the results were as shown in Table 1—1.

Also, the conductive cover made by connecting the cases A and A' was measured for electromagnetic wave shielding properties as in the Example 1—1 to obtain excellent figures as in Example 1—1. Table 1—1 shows the evaluation results about the corrosion resistance and adhesiveness obtained in Examples 1—1 to 1-4 and Reference Examples 1 and 2.

REFERENCE EXAMPLE 3

Electroless plating was given to ABS base material of Example 1—1 and further the nickel-plated cases A and A' were connected to prepare the conductive cover in which electrical continuity between the cases was given by washer and lead wire. The effect of the electromagnetic wave shielding is shown in FIG. 5.

TABLE 1-1

| Test period (hrs) | Evaluation of corrosion resistance | | | | Evaluation of adhesiveness |
|---|---|---|---|---|---|
| | 200 | 350 | 500 | 650 | |
| Example | | | | | |
| 1-1 | 0 | 0 | 0 | 0.5-1 | 100/100 |
| 1-2 | 0 | 0 | 0 | 0.5-1 | 100/100 |
| 1-3 | 0 | 0 | 0 | 0.5-1 | 100/100 |
| 1-4 | 0 | 0 | 0 | 0.5-1 | 100/100 |
| Reference Example | | | | | |
| 1 | 1 | 3 | 3 | 4 | 15/100 |
| 2 | 3 | whole surface swelling | — | — | 91/100 |

EXAMPLE 2-1

To the surface of ABS resin base material 1 and 1' molded for the two cases A and A' used for the upper and lower covers of a lap-top personal computer body as shown in FIG. 1, electroless copper plating and copper oxide layers 3 and 3' were applied.

On the other hand, in 100 parts by weight of acrylic melamine resin (tradename: Honeybrite C-IL, manufactured by Honey Kasai) was dispersed for 30 hours by a ball mill 5 weight parts by weight of alumina having the average particle size of 1 micrometer on the surface of which electroless copper plating was given in the thickness of 0.2 micrometers. Then, the resulting solution was diluted to 15% by weight with desalted water, and 1.0% by weight of carbon black was added for coloring to prepare electrodeposition paint. Thereafter, the above base materials 1 and 1' having copper oxide layers 3 and 3' were soaked in the electrodeposition paint. The electrodeposition was done at 150 V. for 3 minutes under the conditions of the bath temperature being 25° C. and pH being 8-9, using the base material as an anode and 0.5 t stainless plate as a counter electrode to form the 25 μm thick coating layers 4 and 4' containing 30 wt. % of the mixed powder. Following the electrodeposition, water-washing was performed and heating conducted at 97° C.±1° C. in an oven for 60 minutes for curing to obtain the cases A and A'. A test was conducted, as in Example 1—1, for the adhesiveness and corrosion resistance of the electrodeposition layer formed on the cases A and A'. The result was excellent with the adhesiveness being 100/100 and the corrosion resistance 1 mm or less in terms of one-side swelling width. The exterior cover 11 was assembled using the cases A and A' to measure the electromagnetic wave shielding effect. The result is shown in FIG. 5. The electromagnetic wave shielding effect was very superior as shown in FIG. 5, clearing the regulation of FCC and VCCI.

EXAMPLE 2—2

To the entire surface of PPE resin base materials 1 and 1' molded for the two cases A and A' which are used for the upper and lower covers of a lap-top personal computer body as in FIG. 1, electroless copper plating and copper oxide layers 3 and 3" were applied in the same manner as in the Example 1-3.

On the other hand, in 100 parts by weight of alkyd resin (Tradename: TF121, manufactured by Shinto Toryo) was dispersed for 30 hours with a ball mill 5 parts by weight of nickel powder having the average particle size of 0.03 μm and 10 parts by weight of alumina having the average particle size of 1 μm on the surface of which electroless nickel plating was given in the thickness of 0.5 micrometers. Then, the resulting solution was diluted to 15% by weight with desalted water and 1.0 weight % of carbon black was added for coloring to prepare electrodeposition paint.

The above base materials 1 and 1' were soaked in the electrodeposition paint. The electrodeposition was carried out at 150 V. for 3 minutes under the conditions of the bath temperature being 25° C. and pH 8-9, using the base material as an anode and a 0.5 t stainless plate as a counter electrode to form a 25 μm-thick coating layer containing 30 wt. % of the mixed powder. Following the electrodeposition, water-washing was performed and heating conducted at 97° C.±1° C. in an oven for 60 minutes for curing to obtain the cases A and A'. As in the case of Example 2-1, a test was conducted about the adhesion and corrosion resistance of the electrodeposition layer formed on the case. The results was that as in Example 2-1, the adhesion was 100/100 and corrosion resistance was 1 mm or less in terms of one-side swelling width, thus the cases A and A' were sufficiently applicable to an exterior cover.

The electromagnetic shield effect of the exterior cover for the L. T. personal computer body, assembled by using the cases A and A' was excellent as in the case of Example 2-1, clearing the regulations of FCC and VCCI.

EXAMPLE 2-3

On the entire surface of ABS resin base materials 1 and 1' molded for the cases A and A' used for the upper and lower covers of a lap-top personal computer body as in FIG. 1, the copper thin layers 2 and 2', and copper oxide layers 3 and 3' were formed as in the case of Example 1-1.

On the other hand, in 100 weight parts of acrylic melamine resin (Tradename: Honeybrite C-IL, manufactured by Honey Kasei) was dispersed for 30 hours with a ball mill 12 parts by weight of nickel powder having the average particle size of 0.03 μm and 4 parts by weight of silicon carbide having the average particle size of 0.7 micrometers on the surface of which non-electrolytic nickel plating was given in the thickness of 0.2 μm. Then, the resulting solution was diluted to 15% by weight with desalted water, and 2.0% by weight of carbon black was added for coloring to prepare electrodeposition paint. The above base materials 1 and 1' were soaked in the electrodeposition paint. The electrodeposition was conducted at 120 V. for 3 minutes under the conditions of the bath temperature being 25° C. and pH 8-9, using the base material as an anode and a 0.5 t stainless plate as a counter electrode, to form the 20 μm thick coating layer containing 20 wt. % of mixed powder. Following the electrodeposition, water-washing was performed, and heating was conducted at 97° C.±1° C. in an oven for 60 minutes for curing to obtain the cases A and A'. In the same way as in Example 2-1, a test was made for the adhesion and corrosion resistance of the electrodeposition layer formed on the cases A and A'. The result was that as in the Example 2-1, the adhesion was 100/100 and the corrosion resistance was not more than 1 mm in terms of one-side swelling width, thus the cases A and A' were applicable to an exterior cover.

The electromagnetic wave shielding effect of the exterior cover of a lap-top personal computer body assembled using the cases A and N' was very good as in the case of Example 2-1, clearing the regulations of FCC and VCCI.

EXAMPLE 2-4

As in the case of Example 2-1, copper thin layers and copper oxide layers were formed on the entire surface of polycarbonate ABS alloy base material molded for the case A which is used for the upper cover of a lap-top personal computer body as shown in FIG. 3A.

On the other hand, in 100 weight parts of acrylic melamine resin (tradename: Honeybrite, manufactured by Honey Kasei were dispersed for 30 hours with a ball mill 2 parts by weight of silver powder having the average particle size of 0.1 μm and 10 parts by weight of alumina having the average particle size of 1 μm on the surface of which electroless nickel plating was given in the thickness of 0.5 μm. The resulting solution was diluted to 15% by weight with desalted water, and 1.0% by weight of carbon black added for coloring to prepare electrodeposition paint. The above base material was soaked in the electrodeposition paint. Then, electrodeposition was conducted at 150 V. for 3 minutes under the conditions of the bath temperature being 25° C. and pH 8-9, using the base material as an anode and a 0.5 t stainless plate as a counter electrode to form the 25 μm thick layer of containing 30 wt. % of the mixed powder. Following the electrodeposition, water-washing was performed, and heating was conducted at 97° C.±1° C. in an oven for 60 minutes for curing to obtain the case A.

On the other hand, the brass-made base materials 5' molded for the case A' which is used for the lower cover of a lap-top personal computer body was pretreated with electrolytic degreasing and then treated with the mixed aq. solution of 5% sodium hydroxide and 1% potassium persulfate at 70° C. for one minute to form a copper oxide layer as a chemically colored layer.

On the other hand, to 100 parts by weight of acrylic melamine resin (Tradename: Honeybrite C-IL, manufactured by Honey Kasei) was dispersed for 30 hours with a ball mill 5 parts by weight of nickel powder having the average particle size of 0.05 μm and 10 parts by weight of alumina having the average particle size of 0.05 μm on the surface of which electroless nickel plating was given in the thickness of 0.5 micrometers. The resulting solution was diluted to 15% by weight with desalted water, and 1.5% by weight of carbon black was added for coloring to prepare electrodeposition paint. Then, the above base material 5' was soaked in the electrodeposition paint, and the electrodeposition was conducted at 150 V. for 3 minutes under the conditions of the bath temperature being 25° C. and pH 8-9, using the base material as an anode and a 0.5 t stainless plate as a counter electrode to form the 25 μm thick layer containing 30 wt. % of the mixed powder. Following the electrodeposition, water-washing was performed, and heating was conducted at 97° C.±1° C. in an oven for 60 minutes to cure and obtain the case A'.

A test was conducted about the adhesiveness and corrosion resistance of the electrodeposition layer formed on the above upper and lower cases. The result was that as in the case of Example 2-1 the adhesiveness was 100/100 and the corrosion resistance was 1 mm or less in term of one-side swelling width, thus the cases A and A' being sufficiently applicable to an exterior cover.

The electromagnetic wave shielding effect of the exterior 11 of a lap-top personal computer body assembled using the cases A and A' was excellent as in the case of Example 2-1, clearing the regulations of FCC and VCCI.

EXAMPLE 2-5

Electrolytic degreasing was carried out for the contacting surface and its surrounding of the brass-made base materials 5 and 5' of 0.5 mm thickness molded for the cases A and A' used for the shielding case of a desk-top personal computer as shown in FIG. 3 (B). Then, the same parts were treated with a mixed aq. solution of 5% sodium hydroxide and 1% potassium persulfate at 70° C. for one minute to form a copper oxide layer as a chemically colored layer.

On the other hand, to 100 parts by weight of acrylic melamine resin (Tradename: Honeybrite C-IL, manufactured by Honey Kasei) was dispersed for 30 hours with a ball mill 4 parts by weight of copper powder having the average particle size of 0.03 μm and 6 parts by weight of alumina having the average particle size of 1 μm on the surface of which electroless nickel plating was given in the thickness of 0.5 μm. The resulting solution was diluted to 20 wt. % with desalted water, and 1.0 wt. % of carbon black was added for coloring to prepare the electrodeposition paint. Then, the surfaces of the above base materials 5 and 5' on which a copper oxide layer had been formed were soaked in the electrodeposition paint, and the electrodeposition was conducted at 150 V. for 3 minutes under the conditions of the bath temperature being 25° C. and pH 8-9, using the base material as an anode and a 0.5 t stainless plate as a counter electrodes to form the 25 μm thick layer containing 30 wt. % of the mixed powder. Following the electrodeposition, water-washing was performed. Then, the cases 5 and 5' were connected to each other with plastic screws, and were heated at 97° C.±1° C. in an oven for 60 minutes to cure the electrodeposition layer and prepare the shielding case of a desk-top personal computer body. The electromagnetic wave shielding effect of this shielding case was very excellent as in the case of Example 2-1, clearing the regulations of VCCI. Besides, it has been confirmed from this finding that there was good electrical continuity between the cases 5 and 5'.

EXAMPLE 3-1

The entire surface of the ABS resin base materials 1 and 1' molded for the two cases A and A' used for the upper and lower covers of a lap-top personal computer body as shown in FIG. 1 was treated with the etching solution of $CrO_3$-$H_2SO_4$-$H_2O$ for one minute. After water-washing, treatment was made with 30 g/l of stannous chloride and 20 ml/l of hydrochloric acid as sensitizer solution at room temperature for 2 minutes. Then, as activator solution, the mixed solution of 0.3 g/l palladium chloride and 3 ml/l hydrochloric acid was used at room temperature for 2 minutes. Thereafter, plating was done using a electroless copper plating solution (manufactured by Okuno Pharmaceutical) of pH 13.0 at the bath temperature of 70° C. for 5 minutes to form copper thin layer of 0.2 micrometer thickness. Then, the mixed of solution of 5% ammonium chloride and 1% potassium sulfide was used to treatment at 70° C. for one minute to form the copper sulfide layers 3 and 3', a chemically colored layer.

On the other hand, in 100 parts by weight of acrylic melamine resin (Tradename: Honeybrite C-IL, manufactured by Honey Kasei) was dispersed for 30 hours with a ball mill 5 parts by weight of natural mica powder having the average particle size of 1 μm on the surface of which electroless copper plating was given in the thickness of 0.2 μm. The resultant solution was diluted to 15 wt. % with desalted water, and 1.0 wt. % of carbon black was added for coloring to prepare electrodeposition paint. The above base materials 1 and 1' were soaked in the electrodeposition paint. The electrodeposition was given at 150 V. for 3 minutes under the conditions of the bath temperature being 25° C. and pH 8-9, using the base material as an anode and a 0.5 t stainless plate as a counter electrode to form the coating layer 25 μm thick containing 15 wt. % of metalized natural mica powder. Following the electrodeposition, water-washing was made and heating was conducted at 97° C.±1° C. in an oven for 60 minutes for curing to obtain the cases A and A'.

As in the case of Example 1-1, a test was conducted about the adhesiveness and corrosion resistance of the electrodeposition layer formed on the cases A and A'. The results were, as shown in Tables 3-1 and 3-2, excellent, thus the layer being applicable sufficiently in the exterior cover of the cases A and A'.

Also, the exterior cover of a lap-top personal computer was assembled, using the cases thus obtained. Thereafter, the electromagnetic shielding effect was measured. The results are shown in FIG. 5. As seen from FIG. 5, the electromagnetic shielding effect was excellent, being close to the regulated figures of VCCI.

EXAMPLE 3-2

As in Example 1-1, a copper thin layer and a copper oxide layer were formed on the entire surface of the ABS resin base materials 1 and 1' molded for the 2 cases A and A' used for the upper and lower covers of a lap-top personal computer body as shown in FIG. 1. In 100 parts by weight of acrylic melamine resin (Tradename: Honeybrite C-IL, manufactured by Honey Kasei) was dispersed for 30 hours with a ball mill 7 parts by weight of alumina having the average particle size of 1 μm on the surface of which electroless copper plating was given in the thickness of 0.2 μm and 3 parts by weight of natural mica powder having the average particle size of 1 μm on the surface of which electroless copper plating was given in the thickness of 0.2 μm. Then, the resulting solution was diluted to 15% by weight with desalted water, and 1.0 wt. % of carbon black was added for coloring to prepare electrodeposition paint. Subsequently, the above base materials 1 and 1' were soaked in the electrodeposition paint. The electrodeposition was given at 150 V. for 3 minutes under the conditions of the bath temperature being 25° C. and pH 8-9, using the base material as an anode and a 0.5 t stainless plate as a counter electrode to form the coating layer 25 μm thick containing 30 wt. % of the mixed powder. Following the electrodeposition, water-washing was performed, and heating was conducted at 97° C.±1° C. in an oven for 60 minutes for curing to obtain the case A and A'.

A test was carried out for the adhesiveness and corrosion resistance of the electrodeposition coating layer formed on this case. As shown in Tables 3-1 and 3-2, the results were excellent and sufficient for application to exterior covers. The cases obtained were then used to assemble the exterior cover of a lap-top personal computer body. The electromagnetic wave shielding effect was measured and found almost comparable to those shown in Example 3-1, being more or less equal to the VCCI regulation values.

EXAMPLE 3-3

Similarily as in Example 1-3, copper thin layer 2 and copper oxide layer 3 were formed on the entire surface of the PPE resin base materials 1 and 1' molded for the two cases A and N' used for the upper and lower covers of a lap-top personal computer body as in FIG. 1. On the other hand, in 100 weight parts of acrylic melamine resin (Tradename: Honeybrite C-IL, manufactured by Honey Kasei) was dispersed for 30 hours with a ball mill 7 parts by weight of copper powder having the average particle size of 0.05 μm and 3 parts by weight of natural mica powder having the average particle size of 1 μm on the surface of which electroless copper plating was given in the thickness of 0.2 μm. Then, the resulting solution was diluted to 15% by weight with desalted water, and 1.0% weight of carbon black was added for coloring to prepare the electrodeposition paint. The above base materials 1 and 1' were soaked in the electrodeposition paint, and the electrodeposition was conducted at 150 V. for 3 minutes under the conditions of the bath temperature being 25° C. and pH 8-9, using the base material as an anode and a 0.5 t stainless plate as a counter electrode to form the coating layers 4 and 4' 25 μm thick containing 28 wt. % of the mixed powder. Following the electrodeposition, water-washing was performed and heating was conducted at 97° C.±1° C. in an oven for 60 minutes for curing to obtain the cases A and A'.

A test was conducted about the adhesiveness and corrosion resistance of the electrodeposition coating layer formed on the cases A and A'. As shown in Tables 3-1 and 3-2, the result was excellent, and the cases were applicable to exterior covers. The cases thus obtained were used to assemble the exterior cover 11 of the laptop personal computer body. Thereafter, the electromagnetic wave shielding effect was measured. The electromagnetic wave shielding effect was very excellent. almost comparable to the result of Example 2-1, clearing the regulation figures of FCC and VCCI.

EXAMPLE 3-4

Similarily as in Example 1-1, copper thin layers 2 and 2' and copper oxide layers 3 and 3' were formed on the entire surface of the ABS resin base materials 1 and 1' molded for the two cases A and A' used for the upper and lower covers 11 of a lap-top personal computer as shown in FIG. 1. In 100 weight parts of acrylic melamine resin (Tradename: Honeybrite. C-IL, manufactured by Honey Kasei) was dispersed for 30 hours with a ball mill 7 parts by weight of copper powder having the average particle size of 0.05 $\mu$m, 2 parts by weight of alumina having the average particle size of 1 $\mu$m on the surface of which electroless copper plating was given in the thickness of 0.2 $\mu$m and 3 parts by weight of natural mica powder having the average particle size of 1 $\mu$m on the surface of which electroless copper plating was given in the thickness of 0.2 micrometers. Then, the resulting solution was diluted to 15% by weight with desalted water, and 1.0% by weight of carbon black was added for coloring to prepare electrodeposition paint.

The above base materials 1 and 1' were soaked in the electrodeposition paint. The electrodeposition was conducted at 150 V. for 3 minutes under the conditions of the bath temperature being 25° C. and pH 8-9, using the base material as an anode and a 0.5 t stainless plate as a counter electrode to form the 25 $\mu$m thick coating layer 4 containing 29 wt. % of the mixed powder. Following the electrodeposition, water-washing was given and heating was conducted at 97° C.±1° C. in an oven for 60 minutes for curing to obtain the cases A and A'. As in the Example 1—1, a test was made about the adhesiveness and corrosion resistance of the electrodeposition and corrosion resistance of the electrodeposition layer formed on the cases A and A'. The result was excellent as shown in Table 3-1 and 3-2.

The cases thus obtained were used to assemble the exterior cover of a lap-top personal computer body and to measure the electromagnetic wave shielding effect. As a result, the electromagnetic wave shielding effect was very excellent, comparable to those of Example 2-1, clearing the regulation figures of FCC and VCCI.

TABLE 3-1

| Evaluation results about adhesiveness | |
|---|---|
| | Evaluation scores |
| Example | |
| 3-1 | 100/100 |
| 3-2 | 100/100 |
| 3-3 | 100/100 |
| 3-4 | 100/100 |

TABLE 3-2

| Evaluation results about corrosion resistance | | | | |
|---|---|---|---|---|
| Test time | 200 hr | 350 hr | 500 hr | 650 hr |
| Example | | | | |
| 3-1 | 0 | 0 | 0.5–1 | 1–1.5 |
| 3-2 | 0 | 0 | 0.5–1 | 1–1.5 |
| 3-3 | 0 | 0 | 0.5–1 | 1–1.5 |
| 3-4 | 0 | 0 | 0.5–1 | 1–1.5 |

From the results of Table 3-1 and Table 3-2, it has been found with respect to the electrodeposition layers of Examples 3-1 to 3-4 that the adhesiveness is 100/100 and the corrosion resistance is not more than 1.5 mm in terms of one-side swelling width, thus the cases being sufficiently applicable in exterior covers.

EXAMPLE 3-5

In the same was as in Example 1-1, copper thin layers 2 and 2' and copper oxide layers 3 and 3' were formed on the entire surface of the ABS resin base materials 1 and 1' molded for the two cases A and A' used for the upper and lower covers of a lap-top personal computer body as shown in FIG. 1.

On the other hand, in 100 weight parts of acrylic melamine resin (Tradename: Honeybrite C-IL, manufactured by Honey Kasei) was dispersed for 30 hours with a ball mill 3 parts by weight of nickel powder having the average particle size of 0.03 $\mu$m, 3 parts by weight of mica powder having the average particle size of 2.0 $\mu$m on the surface of which non-electrolytic nickel plating was given in the thickness of 0.02 $\mu$m and 4 parts by weight of nylon powder having the average particle size of 1 $\mu$m on the surface of which non-electrolytic copper plating was given in the thickness of 0.2 $\mu$m. Then, the resulting solution was diluted to 15% by weight with desalted water, and 2.0% by weight of carbon black was added for coloring to prepare the electrodeposition paints.

The above base materials 1 and 1' were soaked in the electrodeposition paint. The electrodeposition was given at 120 V. for 3 minutes under the conditions of the bath temperature being 25° C. and pH 8-9, using the base material as an anode and a 0.5 t stainless plate as a counter electrode to obtain the 20 $\mu$m thick coating layer 4 containing 20 wt. % of the mixed powder. Following the electrodeposition, water-washing was performed, and heating was conducted at 97° C.±1° C. in an oven for 60 minutes for curing to obtain the cases A and A'. A test was conducted about the adhesiveness and corrosion resistance of the electrodeposition coating layer formed on the cases. The result was that as in the case of Example 3-1 adhesiveness was 100/100 and corrosion resistance was 1.5 mm or less in terms of one-side swelling width, thus being excellent effect. The electromagnetic wave shielding effect of the exterior cover 11 of a lap-top computer assembled using the cases was, as in the case of Example 3-3, very excellent, clearing the FCC and VCCI regulation values.

EXAMPLE 3-6

Similarily was as in the Example 3-2, copper thin layer 2 and copper oxide layer 3 were formed on the entire surface of the ABS resin base material 1 molded for the case A used for the upper cover of a lap-top personal computer body as shown in FIG. 3A. In 100 weight parts by weight of acrylic melamine resin (Tradename: Honeybrite C-IL, manufactured by Honey Kasei) was dispersed for 30 hours with a ball mill 2 parts by weight of alumina having the average particle size of 1 micrometer on the surface of which electroless nickel plating was given in the thickness of 0.5 $\mu$m and 3 parts by weight of natural mica powder having the average particle size of 1 $\mu$m on the surface of which electroless nickel plating was given in the thickness of 3 parts by weight. Then, the resultant solution was diluted to 15 weight % by weight with desalted water, and 1.0% by weight of carbon black was added for coloring to prepare the electrodeposition paint. Subsequently, the electrodeposition was conducted at 105 V. for 3 minutes under the conditions of the bath temperature being 25°

C. and pH 8–9, using the above base material as an anode and a 0.5 t stainless plate as a counter electrode to form the 25 μm thick coating layer 4 containing 15 wt. % of the mixed powder. Following the electrodeposition, water-washing was performed, and heating was conducted at 97° C.±1° C. in an oven for 60 minutes for curing to obtain the case A.

On the other hand, degreasing by solvent was made for the brass-made base material 1' of 0.5 mm thickness molded for the case A' used for the lower cover of a lap-top personal computer body. Thereafter, the material was treated with the aq. solution of 5% sodium hydroxide and 1% potassium persulfate at 70° C. for one minute to form copper oxide layer as a chemically colored layer.

In 100 weight parts of acrylic melamine resin (Tradename: Honeybrite C-IL, manufactured by Honey Kasei) was dispersed for 30 hours with a ball mill 3 weight parts by weight of alumina having the average particle size of 1 μm on the surface of which electroless nickel plating was given in the thickness of 0.5 μm and 2 parts by weight of mica powder having the average particle size of 1 μm on the surface of which electroless nickel plating was given in the thickness of 0.1 micrometers. Then, the resulting solution was diluted to 15 weight % by weight with desalted water, and 1.5 weight % of carbon black was added for coloring to prepare the electrodeposition paint. With the paint, the electrodeposition was given at 150 V. for 3 minutes under the conditions of the bath temperature being 25° C. and pH 8–9, using the above base material 1' as an anode and a 0.5 t stainless plate as a counter electrode to form the 25 μm thick coating layer 4' containing 15 wt. % of the mixed powder. Following the electrodeposition, water washing was performed and heating was conducted at 97° C.±1° C. in an oven for 60 minutes for curing to obtain the case A'.

A test was conducted about the adhesiveness and corrosion resistance of the electrodeposition layer formed on the two cases A and A'. The result was that as in the case of Example 3-1, the adhesiveness was 100/100 and the corrosion resistance was below 1 mm in terms of one-side swelling width, thus being very excellent. Accordingly, the two cases were applicable sufficiently to the exterior covers.

The electromagnetic wave shielding effect of the exterior cover of a lap-top personal computer cover assembled using the two cases A and A' was superior as in the Example 1-1, clearing the regulation figures of FCC and VCCI.

EXAMPLE 4-1

In the same way as in Example 1-1, copper thin layer and copper oxide layer were formed on the entire surface of the ABS resin base materials 1 and 1' molded for the two cases A and A' used for the upper and lower covers of a lap-top personal computer body as shown in FIG. 1.

On the other hand, in 100 parts by weight of acrylic melamine resin (Tradename: Honeybrite C-IL, manufactured by Honey Kasei) was dispersed for 30 hours with a ball mill 15 parts by weight of nickel powder having the average particle size of 0.03 μm. Then, the resulting solution was diluted with water, and 2.0% by weight of carbon black was added for coloring to prepare the electrodeposition paint.

The above base materials 1 and 1' were soaked in the electrodeposition paint, and the electrodeposition was given at 150 V. for 3 minutes under the conditions of the bath temperature being 25° C. and pH 8–9. using the base material as an anode and a 0.5 t stainless plate as a counter electrode to form the 25 μm thick coating layer 4 containing 30 wt. % of nickel powder. Following the electrodeposition, water-washing was performed. and heating was conducted at 145° C.±1° C. in an oven for 60 minutes for curing to obtain the cases A and A'.

A test was conducted about the adhesiveness and corrosion resistance of the electrodeposition paint coating layer formed on the case. The result was that the adhesiveness was 90/100 and the corrosion resistance was 1.5 mm or less in terms of one-side swelling width, thus being excellent.

The electromagnetic wave shielding effect of the exterior cover of a lap-top computer assembled using the case was as superior as in Example 3-1, being close to VCCI regulation values.

EXAMPLE 4-2

Similarily was as in Example 1-4, copper oxide layers 3 and 3' were formed on the brass plate-made base materials 5 and 5' for the two cases A and A' used for the upper and lower covers of a lap-top personal computer body as shown in FIG. 2.

On the other hand, in 100 parts by weight of acrylic melamine resin (Tradename: Honeybrite C-IL, manufactured by Honey Kasei) was dispersed for 30 hours with a ball mill 10 parts by weight of nickel powder having the average particle size of 0.05 μm. Then, the resulting solution was diluted to 15% by weight with desalted water, and 2.0% by weight of carbon black was added for coloring to prepare the electrodeposition paint. Then, the above base materials 5 and 5' containing copper oxide layers 3 and 3' were soaked in the above electrodeposition paint. Using the paint, the electrodeposition was given at 150 V. for 3 minutes under the conditions of the bath temperature being 25° C. and pH 8–9, using the base material as an anode and a 0.5 t stainless plate as a counter electrode to form the 25 μm thick coating layer. Following the electrodeposition, water-washing was performed, and heating was conducted at 150° C.±1° C. in an oven for 60 minutes for curing to obtain the cases A and A'. The electrodeposition layer of the cases A and a' contained 30 wt. % of metallized ceramic powder.

A test was conducted about the adhesiveness and corrosion resistance of the electrodeposition layer of the cases A and A'. As a result, the adhesiveness was 100/100 and the corrosion resistance was below 1 mm in terms of one-side swelling width, thus the cases A and A' being applicable to the exterior covers.

Subsequently, the cases A and A' were used to assemble the exterior cover of a lap-top personal computer with the cover being fixed by plastic screws, as shown in FIG. 2. The electromagnetic wave shielding effect of the exterior cover was very excellent, clearing the FCC and VCCI regulation values. It is evident from this result that there is good electrical continuity between the case A and A'.

I claim:

1. A conductive cover in which at least two cases are connected to each other at their connecting surfaces, the cases being provided with electrical continuity through a conductive electrodeposition coating layer at the connecting surfaces, and the case having the conductive electrodeposition coating layer comprising a base material layer, and a metal layer, a chemically colored layer and the conductive electrodeposition coating layer formed on the base material.

2. A conductive cover of claim 1 in which the conductive electrodeposition coating layer contains conductive particles.

3. A conductive cover of claim 2 in which the content of conductive particles in the conductive electrodeposition layer is in the range of 5-50 wt. %.

4. A conductive cover of claim 3 in which the content of conductive particles in the conductive electrodeposition layer is in the range of 10-40 wt. %.

5. A conductive cover of claim 2 in which the conductive particles consist of at least one kind of metallized ceramic powders and metallized mica powders.

6. A conductive cover of claim 2 in which the conductive particles consist of at least one kind of metallized resin powders and ultra fine particle metal powders.

7. A conductive cover of claim 2 in which the conductive particles consist of a mixture of at least one kind of powder selected from metallized ceramic powder and metallized mica powders with one or two kinds of powder selected from metallized resin powder and ultra-fine particle metal powder.

8. A conductive cover of claim 1 in which the at least two cases consist of one of i) a non-metal case the surface of which is coated with a conductive electrodeposition layer and a non-metal case the surface of which is coated with a conductive electrodeposition layer, ii) a non-metal case the surface of which is coated with a conductive electrodeposition layer and a metal case the surface of which is coated with a conductive electrodeposition layer, iii) a non-metal case the surfaces of which are coated with conductive electrodeposition layers and a metal case, iv) a metal case the surface of which is coated with a conductive electrodeposition layer and a metal case, and v) a case the surface of which is coated with a conductive electrodeposition layer and a non-metal case coated with plating.

9. A conductive cover of claim 1 in which the thickness of the conductive electrodeposition layer is 5 μm or more.

10. A conductive cover of claim 1 in which the case has a base material and the conductive electrodeposition layer cross-linked.

11. Conductive cover of claim 10 in which the case has the base material, a chemically colored layer and the conductive electrodeposition layer.

12. A conductive cover of claim 1 in which the chemically colored layer is a copper oxide layer.

13. A conductive cover of claim 1 in which the thickness of electrodeposition coating layer is 5-40 μm.

14. An electronic equipment having a source generating electromagnetic wave noise built in a space surrounded by a conductive cover, characterized in that the conductive cover comprises at least two cases which are connected to each other at their connecting surfaces and are provided with electrical continuity through a conductive electrodeposition layer at the connecting surfaces, and the case having the conductive electrodeposition coating layer comprising a base material layer, and a metal layer, a chemically colored layer and the conductive electrodeposition coating layer formed on the base material.

15. An electronic equipment of claim 14 in which the conductive electrodeposition layer contains conductive particles.

16. An electronic equipment of claim 15 in which the conductive particles consist of a least one kind of metallized ceramic powder and metallized mica powder.

17. An electronic equipment of claim 15 in which the conductive particles consist of at least one kind of metallized resin powder and ultra fine particle metal powder.

18. An electronic equipment of claim 15 in which the conductive particles consist of a mixture of at least one kind of powder selected from metallized ceramic powder and metallized mica powder with at least one kind of powder selected from metallized resin powder and ultra-fine particle metal powder.

19. An electronic equipment of claim 15 in which the content of conductive particles in the conductive electrodeposition layer is in the range of 5-50 wt. %.

20. An electronic equipment of claim 19 in which the content of conductive particles in the conductive electrodeposition layer is in the range of 10-40 wt. %.

21. An electronic equipment of claim 14 in which the chemically colored layer is a copper oxide layer.

22. An electronic equipment having a source generating electromagnetic wave noise built in a space surrounded by a conductive cover, characterized in that the conductive cover comprises at least two cases which are connected to each other at their connecting surfaces and provided with electrical continuity through a conductive electrodeposition layer at the connecting surfaces, and the case having the conductive electrodeposition coating layer comprising a base material and a metal layer, a chemically colored layer and the conductive electrodeposition coating layer formed on the base material, and said conductive electrodeposition coating layer contains at least one kind of metallized ceramic powder and metallized mica powder, and the thickness of said conductive electrodeposition coating layer is in the range of 5-40 μm.

23. A conductive cover in which at least two cases are connected to each other at their connecting surfaces, the case being provided with electrical continuity through a conductive electrodeposition coating layer at the connecting surfaces, the case having the conductive electrodeposition coating layer comprising a base material, and a metal layer, a chemically colored layer and the conductive electrodeposition coating layer formed on the base material, and said conductive electrodeposition coating layer contains at least one kind of metallized ceramic powder and metallized mica powder, and the thickness of said conductive electrodeposition coating layer is in the range of 5-40 μm.

* * * * *

UNITED STATES PATENT AND TRADEMARK OFFICE
CERTIFICATE OF CORRECTION

PATENT NO. : 5,170,009
DATED : December 8, 1992
INVENTOR(S) : SUSUMU KADOKURA

Page 1 of 6

It is certified that error appears in the above-identified patent and that said Letters Patent is hereby corrected as shown below:

Title page,
AT [57] ABSTRACT

Line 2, "each" should read --each other--.

COLUMN 1

Line 15, "in" should be deleted.
    Line 18, "wave" should read --wave,--.
    Line 19, "is" should read --are--.
    Line 21, "electronic" should read --electromagnetic--
             and "wave" should read --waves--.
    Line 25, "an" and "subject" should be deleted.
    Line 40, "each" should read --with each--.
    Line 42, "wave leaks" should red --waves leak--.
    Line 66, "fixing" should read --the fixing--.

COLUMN 2

Line 64, "layer." should read --layers.--.
    Line 67, "room" should read --a space--.

UNITED STATES PATENT AND TRADEMARK OFFICE
CERTIFICATE OF CORRECTION

PATENT NO. : 5,170,009
DATED : December 8, 1992
INVENTOR(S) : SUSUMU KADOKURA

It is certified that error appears in the above-identified patent and that said Letters Patent is hereby corrected as shown below:

COLUMN 3

Line 15, "become" should read --becomes--.
    Line 19, "through" should read --thorough--.
    Line 31, "other" should read --another--.
    Line 42, "electromagentic" should read --electromagnetic--.
    Line 57, "therein-" should read --(herein- --.
    Line 59, "electromagentic" should read --electromagnetic--.
    Line 60, "of" should read --of the--.
    Line 64, "FIG. 1 shows" should read --FIGS. 1A and 1B show--.
    Line 67, "and (A) is" should read --FIG. 1A being-- and "(B) is" should read --FIG. 1B a--.

COLUMN 4

Line 3, "point, one" should read --point. One--.
    Line 8, "A has" should read --A' has--.
    Line 18, "case" should read --cases--.
    Line 23, "shield" should read --shielding--.
    Line 52, "enable" should read --enables--.

COLUMN 5

Line 36, "molybednum" should read --molybdenum--.
    Line 67, "thereof 1" should read --thereof,--.

UNITED STATES PATENT AND TRADEMARK OFFICE
CERTIFICATE OF CORRECTION

PATENT NO. : 5,170,009
DATED : December 8, 1992
INVENTOR(S) : SUSUMU KADOKURA

It is certified that error appears in the above-identified patent and that said Letters Patent is hereby corrected as shown below:

COLUMN 6

Line 23, "those" should read --one--.
Line 44, "leave" should read --leaves--.
Line 47, "X-ray" should read --an X-ray--.
Line 68, "a metal" should read --metal--.

COLUMN 7

Line 2, "electro" should red --electro- --.
Line 8, "has" should read --having--.
Line 31, "periphery" should read --the periphery--.

COLUMN 8

Line 30, "is" should red --are--.

COLUMN 9

Line 15, "a" should read --an--.
Line 32, "other" should read --another--.
Line 64, "shield" should read --shielding--.
Line 65, " FIGS. 1A" should read --in FIGS. 1A--.

COLUMN 10

Line 14, "in case" should be deleted.
Line 24, "improves" should read --improve--.
Line 25, "has the" should read --has--.
Line 61, "examples In" should read --examples.  In--.

UNITED STATES PATENT AND TRADEMARK OFFICE
CERTIFICATE OF CORRECTION

PATENT NO. : 5,170,009
DATED : December 8, 1992
INVENTOR(S) : SUSUMU KADOKURA

It is certified that error appears in the above-identified patent and that said Letters Patent is hereby corrected as shown below:

COLUMN 11

Line 41, "both" should read --bath--.
Line 43, "an" should read --a--.

COLUMN 12

Line 11, "resin-moled" should read --resin-molded--.
Line 29, "an" should read --a--.
Line 40, "was" should red --were--.

COLUMN 13

Line 30, "this" should read --these--.
Line 38, "over" should read --oven--.

COLUMN 14

Line 44, "to" should read --for--.

COLUMN 19

Line 23, "to treatment" should be deleted.

UNITED STATES PATENT AND TRADEMARK OFFICE
CERTIFICATE OF CORRECTION

PATENT NO. : 5,170,009
DATED : December 8, 1992
INVENTOR(S) : SUSUMU KADOKURA

Page 5 of 6

It is certified that error appears in the above-identified patent and that said Letters Patent is hereby corrected as shown below:

COLUMN 20

Line 35, "N'" should read --A'--.

COLUMN 22

Line 5, "was" should read --way--.
Line 48, "was" should be deleted.

COLUMN 24

Line 45, "a'" should read --A'--.
Line 59, Close up right margin.
Line 60, Close up left margin.

COLUMN 25

Line 14, "powders" should read --powder--.
Line 17, "powders" should read --powder--.
Line 18, "ders." should read --der.--.
Line 22, "powders" should read --powder--.
Line 46, "Conductive" should read --A conductive--.

UNITED STATES PATENT AND TRADEMARK OFFICE
CERTIFICATE OF CORRECTION

PATENT NO. : 5,170,009
DATED : December 8, 1992
INVENTOR(S) : SUSUMU KADOKURA

It is certified that error appears in the above-identified patent and that said Letters Patent is hereby corrected as shown below:

COLUMN 26

Line 3, "and" should be deleted.

Signed and Sealed this

Twenty-sixth Day of April, 1994

Attest:

BRUCE LEHMAN

Attesting Officer     Commissioner of Patents and Trademarks